United States Patent [19]

Scott et al.

[11] Patent Number: 4,719,434

[45] Date of Patent: Jan. 12, 1988

[54] VARACTOR TRIMMING FOR MMICS

[75] Inventors: Bentley N. Scott, Richardson; Gailon E. Brehm, Plano, both of Tex.

[73] Assignee: Texas Instruments Incorporated, Dallas, Tex.

[21] Appl. No.: 917,270

[22] Filed: Oct. 8, 1986

Related U.S. Application Data

[63] Continuation of Ser. No. 548,182, Nov. 1, 1983, abandoned, which is a continuation of Ser. No. 292,862, Aug. 14, 1981, abandoned.

[51] Int. Cl.⁴ .............................................. H03H 11/28
[52] U.S. Cl. ......................................... 333/32; 333/33; 333/246
[58] Field of Search ........................... 333/32, 33, 205; 331/77, 107 SL, 117 D, 176

[56] References Cited

U.S. PATENT DOCUMENTS

| | | | |
|---|---|---|---|
| 3,132,313 | 5/1964 | Alford | 333/32 |
| 3,404,320 | 10/1968 | Mash | 357/14 |
| 3,412,348 | 11/1968 | Hull | 333/32 X |
| 3,745,487 | 7/1973 | Milard et al. | 333/33 X |
| 3,831,109 | 8/1974 | Leiby | 331/176 X |
| 4,048,598 | 9/1977 | Knight | 333/32 X |
| 4,189,690 | 2/1980 | Bock et al. | 331/117 D X |
| 4,243,949 | 1/1981 | Saul et al. | 331/176 X |

OTHER PUBLICATIONS

Van Tuyl, *A Monolithic GaAs FET RF Signal Generation Chip,* 1980 IEEE Int'l. Solid-State Circuits Conference, pp. 118, 119 of Digest of Tech. Papers.

*Primary Examiner*—Paul Gensler
*Attorney, Agent, or Firm*—Carlton H. Hoel; Leo N. Heiting; Melvin Sharp

[57] ABSTRACT

Varactors are incorporated in a monolithic microwave integrated circuit (MMIC) to provide voltage-programmable impedance matching at inputs and/or outputs. This permits the impedance variations normally caused by manufacturing variations in (e.g.) doping or epitaxial thickness to be easily compensated by adjusting the varactor bias, after all major manufacturing steps are completed.

Integrated varactors are also used to provide temperature compensation in an MMIC. A temperature-sensitive voltage is generated off-chip and supplied to each on-chip varactor. Each varactor may include a respective voltage-shifting network, so that different varactors implement different capacitance (temperature) functions, to optimally compensate different portions of the MMIC.

8 Claims, 6 Drawing Figures

VARACTOR TRIMMING FOR MMICS

CROSS-REFERENCE TO RELATED APPLICATIONS

This application is a continuation of application Ser. No. 548,182, filed Nov. 1, 1983 and now abandoned, which was a continuation of application Ser. No. 292,862, filed Aug. 14, 1981 and now abandoned.

The following applications of common assignee and filed concurrently with the present application contain related subject matter and are hereby incorporated by reference: Ser. No. 292,770, now abandoned in favor Ser. No. 665,494, filed Oct. 29, 1984, now abandoned, Wide-Ratio Monolithic Microwave Varactor: Ser. No. 293,040, now U.S. Pat. No. 4,481,487, Monolithic Microwave Wide-Band VCO; Ser. No. 292,769, now U.S. Pat. No. 4,463,322, Self-Biasing for FET-Driven Microwave VCOs.

BACKGROUND OF THE INVENTION

The present invention relates to impedance matching for monolithic microwave integrated circuits (MMICs).

A difficulty in realizing the potential of MMIC technology is impedance matching. The ubiquity of significant parasitic reactances in MMIC design has no parallel in conventional IC technology, since at microwave frequencies unwanted inductances and capacitances are very easily created by very small changes in the physical size and/or spacing of components.

While it is of course possible to use conventional matching stages off-chip to compensate for impedance mismatches produced by such parameter variation, such matching networks are necessarily bulky and would destroy much of the advantage obtained by using MMICs in the first place. Alternatively, if no matching network is used, the performance of circuits including an MMIC, and particularly that of circuits including multiple MMICs, would be degraded. Similarly, a substantial percentage of MMICs manufactured would have to be rejected because their impedance characteristics were too far away from the design values.

It is thus an object of the invention to provide an impedance matching stage which can easily be incorporated within an MMIC.

If a matching network is used, the time required to tune the matching network must not consume too large a percentage of the manufacturing time. Ideally, it should be possible to program the impedance characteristics of the MMIC after all major manufacturing steps have been completed. A very convenient method of doing so would be to have a voltage-programmable impedance characteristics, so that a chip which had completed the major stages of manufacture could be connected to a chip tester which would, while testing the chip for faults, also determine the correct programming voltage to produce the desired output impedance characteristics.

Thus, it is a further object of the present invention to provide an MMIC which has voltage-programmable impedance characteristics.

A related difficulty arises when it is desired to operate an MMIC over a very wide band of frequencies, not necessarily simultaneously. For example, a communications receiver which is to down convert different bands must, aside from the hardware required for band-switching, have some means to provide at least tolerable impedance matches at each of the operating bands.

Thus, it is a further object of the present invention to provide means for dynamically reprogramming the impedance characteristics of MMICs which are operated over a very wide frequency range.

A particulary acute problem in the development of MMICs, to which no satisfactory solution has yet been found, is temperature compensation. At present, this is conventionally accomplished by using one or more thermistors to control a p-i-n diode network off-chip, providing variable attenuation. However, not only is this solution bulky, it also permits only one attenuation (temperature) function for each off-chip thermistor module. Since temperature compensation should optimally be different for different MMIC circuits, it would be highly desirable to have some method of on-chip temperature compensation which could be tailored to the temperature curves of the particular MMIC circuit involved.

It is thus a further object of the present invention to provide on-chip temperature compensating elements for MMICS.

It is a further object of the present invention to provide on-chip temperature compensating elements for MMICs which can provide various selected compensating functions, in response to a single externally generated voltage signal indicative of temperature.

In assembling microwave modules, the intrinsically variable impedance characteristics of microwave chips, resulting from the normal parameter variations which occur in manufacturing, create difficulties in properly matching interfaced components of the module together. Either additional matching elements must be used, which is bulky and time consuming as discussed above, or other steps must be taken to avoid excessive mismatch between adjacent elements. At present, the most common method of assembling such microwave modules (e.g. where a plurality of MMIC chips are to be united in a thin film structure on an aluminum substrate) is to first characterized chips produced in the production run. Impedance matches among the chips as tested are then made by sorting, to assemble as many acceptably matched modules as possible. Some of the remaining chips then have their parameters altered, and a further sorting process is then made to attempt to find new matches. This process is necessarily time consuming and expensive, and also necessitates use of batch production methods.

Thus, it is a further object of the present invention to provide MMICs, such that the MMICs can be assembled into microwave modules without any step of sorting the MMICs according to their impedance characteristics being required.

Implementation of microwave systems frequently requires circulators, to interface different functional modules while maintaining acceptable isolation. However, circulators are bulky and extremely expensive, and it would be desirable to minimize their use. This could be accomplished if the overall VSWR of the respective modules could be improved.

Thus, it is a further object of the present invention to provide MMICs which, when assembled into modules, will minimize the VSWR for the whole module.

In particular, one MMIC in which very wide-band frequency response is desirable, and to which varactor trimming for output impedance-matching is particularly applicable, is a monolithic microwave wide-band VCO.

If an integrated varactor is used in such a wide-band monolithic VCO, an additional varactor for output impedance-match trimming can easily be formed simultaneously by the same process steps. However, it has not hitherto been possible to form a monolithic varactor which could easily be integrated in an MMIC and which had adequately wide-band impedance characteristics.

Conventional varactor diodes, particularly those with large tuning ratios (hyperabrupt diodes) require highly conductive substrate material and relatively thick epitaxial layers (greater than one micron). These material requirements are not compatible with the requirements of GaAs FET-monolithic microwave integrated circuits (MMICS) which require a thin (less than one-half micron) uniformly doped active layer on a semi-insulating substrate. To integrate the conventional hyperabrupt diode on a semi-insulating substrate requires a very complicated selective epitaxial deposition, wherein certain areas of the substrate surface receive one epitaxial layer, and other areas receive a different epitaxial layer. The materials required to implement a varactor in an MMIC should be the same as or similar to those for an FET, so that varactors can easily be integrated in, e.g., monolithic microwave voltage controlled oscillators.

Thus, it is an object of the present invention to provide a monolithic microwave integrated circuit incorporating a wide-ratio varactor in a thin uniformly doped active layer above a semi-insulating substrate.

R. VanTuyl, "A Monolithic GaAs FET RF Signal Generation Chip", *ISSCC-80 Digest* 118 (which is hereby incorporated by reference) discloses a gallium arsenide varactor diode in an MMIC which is integrated in a thin epitaxial layer on a semi-insulating substrate. The VanTuyl device does not, however, provide very wide capacitance tuning characteristics. A wide capacitance range (of a decade or more) is essential for many microwave applications. In addition, the VanTuyl device is designed for operation only at lower microwave frequencies (of at most 4 GHz).

The frequency tuning range of a varactor-based VCO is much narrower than the capacitance range of the tuning varactor, due to the inherent and parasitic reactance characteristics of FETs and other components of the VCO. In particular, an extremely wide-range varactor (having a capacitance ratio of a decade or more) is needed if the frequency range of the VCO is to remotely approach one octave.

Thus, it is an object of the present invention to provide a VCO having a tuning range of 1.5 to 1 or larger at microwave frequencies. It is a further object of the present invention to provide a VCO having a tuning range of 1.3 to 1 or better at microwave frequencies above 5 GHz.

It is a further object of the present invention to provide a microwave VCO having a tuning range of an octave or more.

It is a further object of the present invention to provide a monolithic microwave VCO having a tuning range of 1.5 to 1 or larger.

A major difficulty which arises in microwave VCOs having such a large frequency range is maintaining the correct impedance match to achieve the maximum obtainable bandwidth. Mismatch can easily become such as to gravely impair performance.

However, in a monolithic microwave integrated circuit even trimming (to achieve impedance match at one particular frequency) is difficult, and optimal matching over a wide range of frequencies is presently impossible.

Thus, it is a further object of the present invention to provide means for maintaining impedance matching of a monolithic microwave wide-band VCO over a very large frequency range.

SUMMARY OF THE INVENTION

A varactor and a separate bias voltage supply is used for impedance-matching within an MMIC. In the principal embodiment discussed, a monolithic microwave integrated circuit (MMIC) VCO is configured together with such an impedance matching circuit in the source side of the oscillator FET.

According to the present invention, there is provided: a monolithic microwave integrated circuit (MMIC) comprising: means for implementing a selected microwave function; and matching means connected to said implementing means, for matching the impedance characteristics of said implementing means to a desired impedance level, said matching means comprising: an impedance matching network connected to said implementing means, said impedance matching network comprising a varactor, and bias means, connected to said varactor for providing a bias voltage across said varactor.

BRIEF DESCRIPTION OF THE DRAWINGS

The present invention will be described with reference to the accompanying drawings, wherein.

DESCRIPTION OF THE PREFERRED EMBODIMENTS

The present invention will be discussed with particular reference to a principal illustrative embodiment, wherein the present invention is applied to attain better output matching for a very wide-band VCO integrated as an MMIC.

Figure 1:
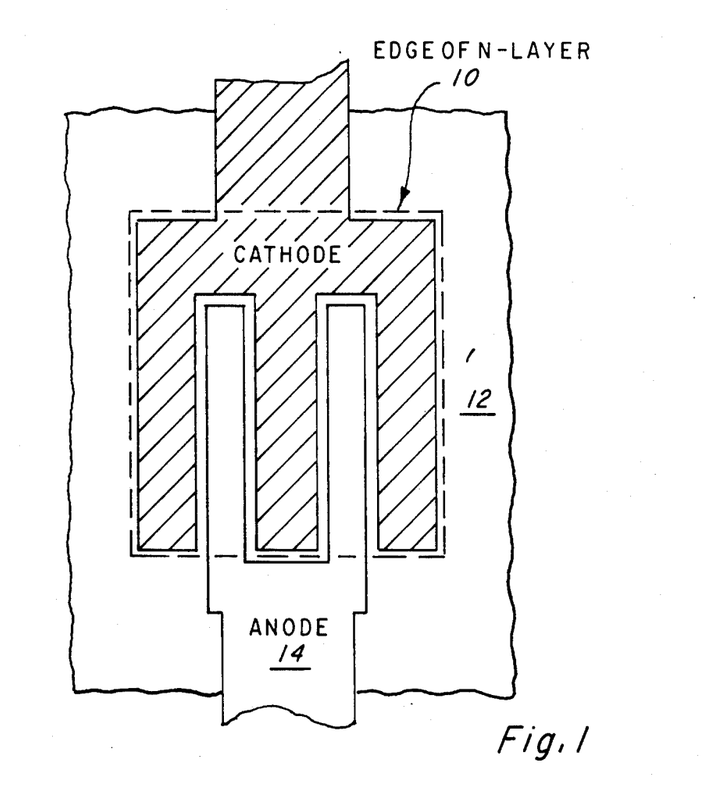
FIG. 1 is a top view of a monolithic varactor diode used in the present invention.

FIG. 1 is a top plan view of the varactor used in the present invention. Ion implantation (e.g., $5 \times 10^{12}/cm^2$ of Si at 200 keV) forms an n-type layer 10 on a semi-insulating substrate 12 preferably Cr-doped GaAs). Alternatively epitaxial growth may be used to form the layer 10. An anode 14 and a cathode 16 are then formed in an interdigitated relation above the n-type layer 10. The anode forms a Schottky barrier with respect to the n-type layer 10, and the cathode 16 forms an ohmic contact.

Each finger of the anode is preferably 6 microns wide and 150 microns long. The anode is a deposited layer of, for example, Ti/Pt/Au. The spacing between the anode and cathode is nominally 2 microns.

Figure 2:
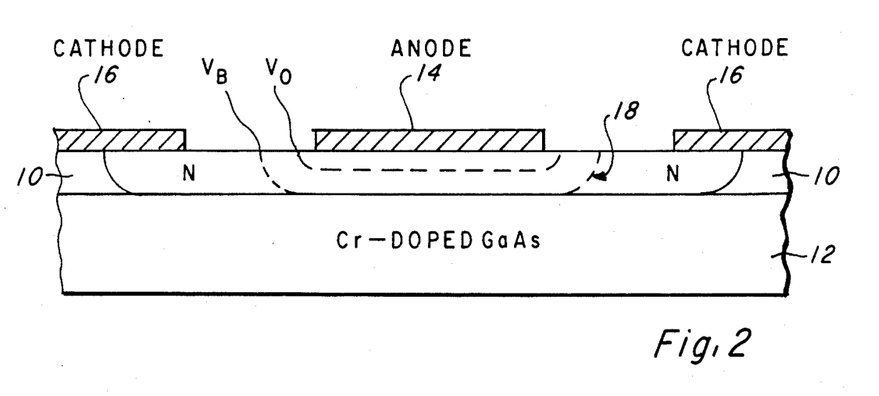
FIG. 2 is a cross-sectional elevation of one finger of the varactor diode used in the present invention.

FIG. 2 shows a cross section across one finger of the anode 14 and portions of two fingers of the cathode 16.

The dotted lines $V_0$ and $V_B$ show the respective depletion regions adjacent the anode at 0 volts and at the breakdown voltage, respectively. As these curves show, the effective area of the anode between the punch through voltage and the breakdown voltage is limited to only the approximately vertical portion 18 of the depletion boundary $V_B$. By contrast, at 0 bias the anode 14 has the effective area shown by the depletion boundary $V_0$, which is slightly larger than the physical area of the anode 14 itself.

Thus, a wide capacitance ratio is achieved, because the doping/thickness product of the epitaxial layer 10 is controlled to allow punch through before breakdown. In the preferred embodiment, the layer 10 is 300 nanometers thick. If the thickness is greater than 300 nm, the concentration of impurities should be reduced proportionately. At punch through, the effective diode area is reduced to that of the sidewall. As a result, a very large capacitance ratio is achieved by proper choice of the geometry.

In practice, a tradeoff must be made between the Q and the capacitance ratio. The Q is limited by the parasitic series resistance for current flowing laterally under the anode before punch-through. Since the current beneath the anode is confined to the region of epitaxial layer 10 which lies beneath the depletion boundary and this layer becomes thinner as the depletion boundary approaches punch-through, a large effective series resistance appears just before punch-through.

After punch-through, this series resistance is reduced to that of only the region from the vertical depletion boundary 18 to the cathode 16, and very high Q's are observed. This series resistance is, of course, larger if the finger width is larger.

To reduce the punch-through voltage, a recess may be etched out under the whole surface of the anode, before the anode metallization is deposited. Thus, for example, where the layer 10 is 300 nanometers thick, 100 nanometers would be etched away before the anode is deposited. Thus, the punch-through voltage is reduced, since the anode is accordingly closer to the substrate, whereas the breakdown voltage is not reduced, since the anode is no closer to the cathode. In fact, the breakdown voltage may be slightly increased, since the surface portions of the layer 10 are likely to be slightly more heavily doped than the lower portions of the layer 10. Since such recessed structures are frequently used for the channel regions of microwave FETSs, to reduce the series resistance of the source and drain regions adjacent the channel, such an anode recess is also compatible with familiar microwave integrated circuit technology. An anode which is recessed in this fashion, to approximately ⅓ of the depth of the layer 10, constitutes the presently preferred embodiment of the varactor.

Figure 3:
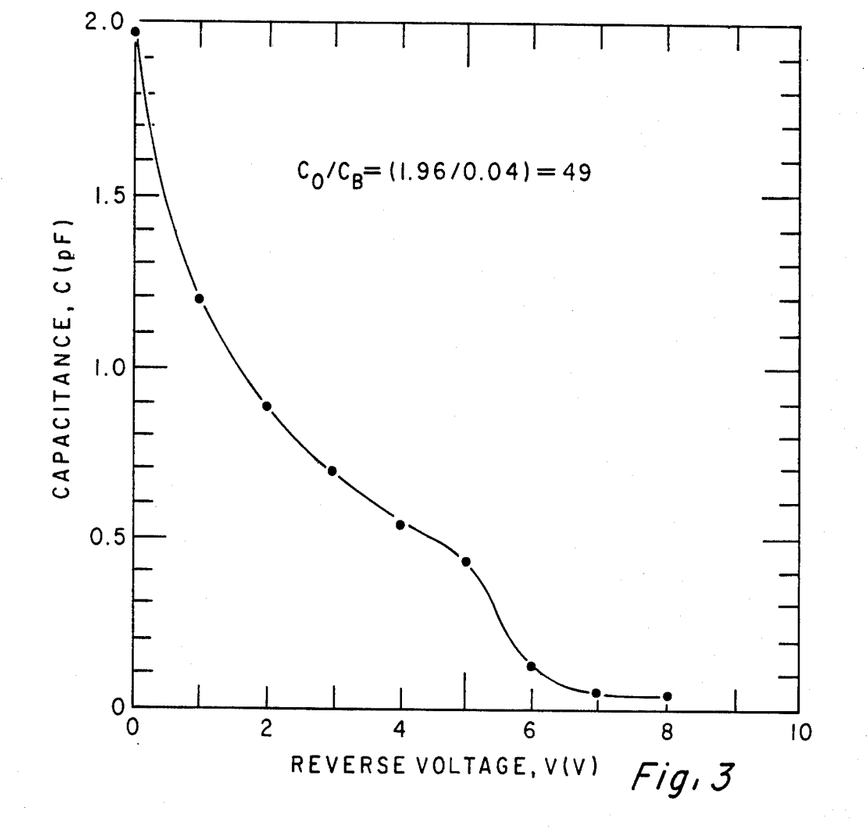
FIG. 3 shows a sample capacitance/voltage curve of the varactor used in the present invention.
Figure 4:
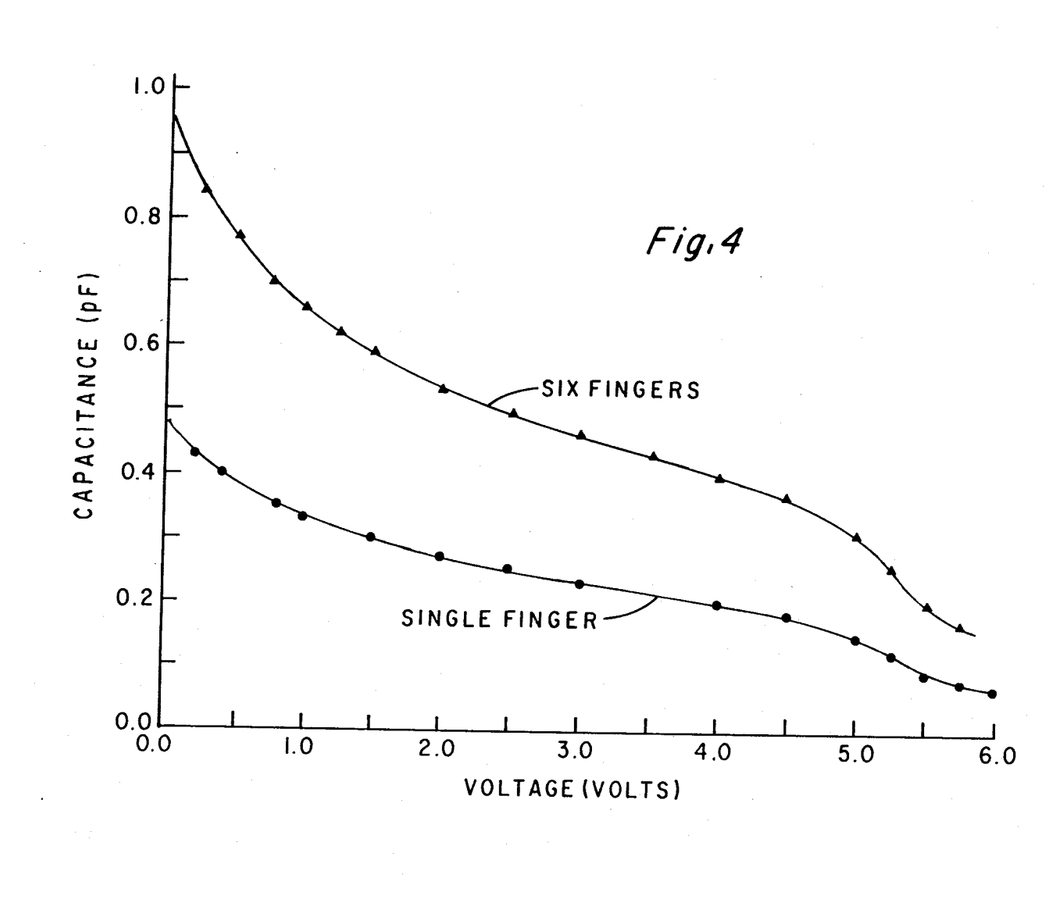
FIG. 4 compares the capacitance/voltage characteristics of a single-finger and of a six-finger varactor suitable for use in the present invention.

FIG. 3 shows the capacitance/voltage characteristics of a varactor constructed for use in the present invention. A 6 by 150 micron Ti/Pt/Au anode finger is placed between cathode areas two microns away. The layer 10 is 300 nm thick n-type ion implanted gallium arsenide, like that used for FETs. The substrate is chromium doped gallium arsenide. The anode is placed in a 100 nm etched recess, so that the anode is 200 nm above the substrate. In this embodiment, the capacitance decreases from 1.96 pF at 0 bias to 0.04 pF at $-7$ volts. This 49 to 1 capacitance ratio is achieved because of the extremely rapid capacitance decrease as puch through occurs between 5 and 7 volts. Calculated cutoff frequency for this diode is 28 GHz at 0 volts bias and 2.5 THz at 10 volts.

Of course, multi-finger embodiments of this planar varactor design may also be constructed.

The implantation parameters which optimize the n-type region 10 for construction of the varactor according to the present invention may be slightly different from those used to optimize the epitaxial layer for construction of FETs. For example, a slightly lower implantation dose (e.g. $3 \times 10^{12}/cm^2$) at a slightly higher energy (e.g. 400 KeV) would be used to construct a varactor according to the present invention, to obtain higher breakdown voltage. Thus, selective implantation of a monolithic chip containing both varactors and FETs would permit optimization of performance. However, the required characteristics for FETs and for the varactor according to the present invention are sufficiently close that, although selective implantation can provide a marginal advantage and performance, it is not required.

Passivation, in the presently preferred embodiment, is achieved by the following sequence of processing steps: First, the cathode metallization is deposited. Then 1000 Angstroms of silicon nitride are deposited over the whole surface of the device. The anode recess is then patterned and etched, to approximately ⅓ of the thickness of the layer 10. The anode metallization is then deposited, and any necessary contacts are then formed. Finally, 3000 Angstroms more of silicon nitride are deposited overall. Clean-up, at appropriate intermediate points of the process, is performed using, e.g., ammonium hydroxide and water.

To further improve varactor performance, by further increasing the breakdown voltage, additional steps may alternatively be inserted to reduce the density of surface states. For example, an additional etching step may be applied overall, after the anode has been deposited, or an additional reagent may be used for clean-up.

Nitride assisted lift-off, if used to form the anode 14, improves the breakdown voltage of the varactors of the present invention. This technique places the anode metal back from the edge of the etched recess, and passivates the surface of the gallium arsenide. The parameters for this process are well known to those skilled in the art. (see, e.g. Proceedings of the Cornell Conference on Microwave Semiconductor Devices, 1981, p. 157, "High Yield, Reproducible process Techniques for microwave GaAs FETs", G. E. Brehm, F. H. Doerbeck, W. R. Frensley, H. M. Macksey, and R. E. Williams).

As will be obvious to those skilled in the art, numerous modifications may be performed, within the scope of the inventive concepts described above, to construct a varactor for use in the present invention. For example, p-type material could be used in the layer 10, although different metal composition would be required to create a Schottky barrier contact. Other semiconductor materials could also be used, provided that a doped semiconducting layer was lattice-matched to a semi-insulating substrate.

Figure 5:
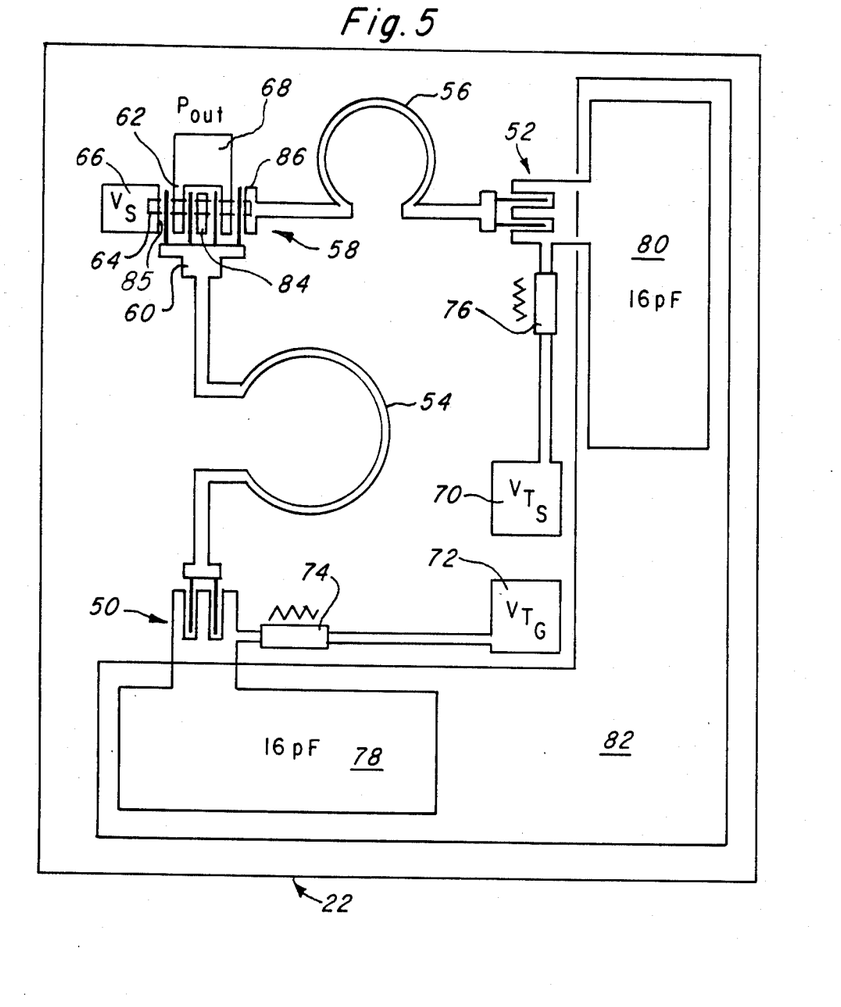
FIG. 5 shows a VCO incorporating the present invention.

An embodiment of an integrated microwave wideband VCO according to the present invention is shown in FIG. 5. The VCO circuit 22, represents the presently preferred embodiment. The VCO 22 is a "common gate" oscillator, having loop inductors 54 and 56 and varactors 50 and 52 respectively connected from the gate and source terminals of FET 58 to RF ground. MIM capacitors 78 and 80 (each 16pF) to ground are used for RF bypassing, and 2.5 kilohm GaAs resistors are included at 74 and 76 are included in the high impedance bias lines to help suppress low frequency oscillations, to aid in isolating the DC bias lines from RF, and to act as a DC current limit. Bonding pads 72 and 70 are respectively provided for the gate and source tuning varactor voltages and pad 66 is for DC-grounding of the source 84, 85 and 86. External means of biasing the drain 62 and of matching the drain output 68 to 50 ohms must be provided.

No DC return is provided for the gate 60 since the bias point for the gate is established by clipping the RF gate voltage. This occurs in the FET 58, as described below.

While the structure of the FET is in almost all respects conventional, it does not have one important feature which cooperates in the novel operation of the VCO according to the present invention. The gate fingers from a Schottky barrier with the channel region, and thus RF voltages in the gate circuit are clipped by the Schottky barrier to form the necessary gate bias. This has the outstanding advantages that the gate tuning network in the present invention consists simply of the inductor 54 and the varactor 50, and other circuits normally required to establish the gate operating point, which would have high frequency resonances, are not included. This permits easy operation of a microwave oscillator over an extremely broad bandwidth.

Thus, the processing steps required to form the monolithic VCO in accordance with the present invention, as described above, are as follows: the starting material is an n-type epitaxial (or implanted) layer on a semi-insulating substrate, preferably n-type GaAs on a CR-doped GaAs substrate. 1. A mesa etch step is first. Photoresist is applied and patterned, and the epitaxial layer is then etched accordingly, to remove all portions of the epitaxial layer which are not needed. For example, portions of the epitaxial layer are left where the varactors 50 and 52 will formed, and where the channel region of FET 58 will be formed. Portions of the epitaxial layer are also used to form the resistance elements 74 and 76. 2. Alignment marks are then deposited and etched, to provide E-beam control. A silicon nitride protective layer, of e.g. 1000 Angstroms, is then deposited only over the align marks. (Alignment marks are not shown within the VCO 22 of FIG. 5, but the positioning and use of E-beam alignment marks within a wafer is well known to those skilled in the art.) 3. Ohmic contacts are then formed. Photoresist is deposited and patterned to form the source and drain regions of FET 58, and the respective cathodes of varactors 50 and 52. Au/Ge/Ni is then deposited, lift-off is performed, and alloying is then performed, all conventionally. 4. The next stage is gate patterning. 1000 Angstroms of silicon nitride is deposited over all. E-beam resist is deposited, and E-beam patterning is then applied to define the gate fingers of FET 58 and the anode fingers of varactors 50 and 52. The silicon nitride in these patterns is then etched, and the epitaxial layer is then etched, to approximately one third of its thickness, where it has been exposed. Thus, where the epitaxial layers 3000 Angstroms thick, approximately 1000 Angstroms will be etched away in the present step. Ti/Pt/Au is then deposited, to form Schottky barriers to the epitaxial layer within these etched recesses, for the gate and anodes. Lift-off is then performed. 5. A first-level metallization step is then performed. 4000 Angstroms of silicon nitride is deposited overall, and photoresist patterning and etching of the nitride is performed (conventionally) to define the first metallization. This includes the bottom plate 82 of the capacitors 78 and 80, the inductors 54 and 56, the contact pads 66, 68, 70, and 72, and most of the remaining wiring. The patterning at this stage also exposes the source and drain fingers of the FET and the cathodes of the varactors 50 and 52, so that more metal is deposited on these structures to lower their resistance. Lift-off is then performed conventionally. 6. A top plate patterning step is then applied. First, 3000 Angstroms of silicon nitride are deposited overall. This nitride forms a passivating layer over the varactors 50 and 52, and also forms the dielectric layer of the two RF-grounding capacitors 78 and 80. The top plates of capacitors 78 and 80 are then patterned (using photoresist), and TiAu is then deposited. Lift-off is then conventionally performed. 7. Finally, air-bridge connections are formed. First, photoresist is patterned to form vias, where (e.g.) the air bridge 64 contacts the source contact 66, the middle source finger 84, and the source finger 86. Nitride etching is then performed where the vias have been patterned, and pure gold is deposited by sputtering. The photoresist is not removed, but is left in place, since it will be needed to support the air-bridge 64. A further layer of photoresist is then deposited, and patterned to form the actual air bridge connection, and gold is then deposited by electroplating. All photoresist is then stripped. As is well-known in the art, such air-bridge structures have the advantage of reducing stray capacitance. For clarity, only one air-bridge connection is shown in FIG. 5, (across the source fingers of FET 58), but air-bridge connections are also generally used to connect first- and second-level metallizations. Thus, air-bridges are also preferably formed between varactor 50 and the top plate of capacitor 78, and between varactor 52 and capacitor 80.

Thus, the monolithic VCO 22 is connected to a power supply across source terminal 66 and drain terminal 68, and provides oscillator output power at terminal 68. The source tuning terminal 70 and the gate tuning terminal 72 are used to provide bias voltages which respectively control the varactors 52 and 50. The varactor 50 is the primary tuning reactance for the VCO, and the varactor 52 is used to tune the source circuit, to provide optimal matching for broad-band capability.

Of course, the broader the tuning range of the monolithic varactor which is integrated in the MMIC, the greater the range of impedances which can be matched. For example, basis manufacturing parameters (such as epitaxial thickness, doping, line width, etc.) may vary by 15–20percent. Accordingly, such device parameters as transconductance or gain of an FET may vary, and input or output impedances may also vary. In particular, the input or output impedance, if designed for value of (e.g.) 50ohms, may often be found to be as low as 25 ohms or as high as 100 ohms, which would normally cause a 2:1 VSWR if no matching network were used. To attain matching over such a 4:1 range of possible impedances, a broad range of selectable values in the varactor used is obviously desirable.

However, the varactor discussed above does have two significant limitations, when used for this purpose. First, as discussed above, the preferred varactor will have more losses (and low Q) for certain bias values, i.e. just short of punch through. Second, since the maximum capacitance of the 5-finger embodiment of the varactor discussed above is only on the order of three pF, such an integrated varactor is applicable primarily to higher microwave frequencies.

When impedance-match trimming is used in this fashion, it is necessary only to connect a constant voltage to the impedance-matching varactor (i.e., in the VCO 22 of FIG. 5, to the source tuning terminal 70), at least at a given temperature. To ascertain the voltage required for optimal matching, the finished chip is simply connected to an analyzer (such as an HP8409 manufactured by Hewlett-Packard Co). The circuit analyzer then can scan through the possible bias voltages for the impedance-matching varactor, until the output (or input) impedance is correctly set. Once the correct bias voltage for the matching varactor has been ascertained, it can be programmed in by one of several conventional means. For example, the MMIC may be constructed to include fuses, which are selectively blown to short out portions of a resistor network, or a selective bonding step may be performed to provide the desired DC bias voltage, or resistor-trimming methods may be applied. In any case, the DC bias network should have elements such as capacitor 80 and resistor 76, to stabilize the bias network.

Figure 6:
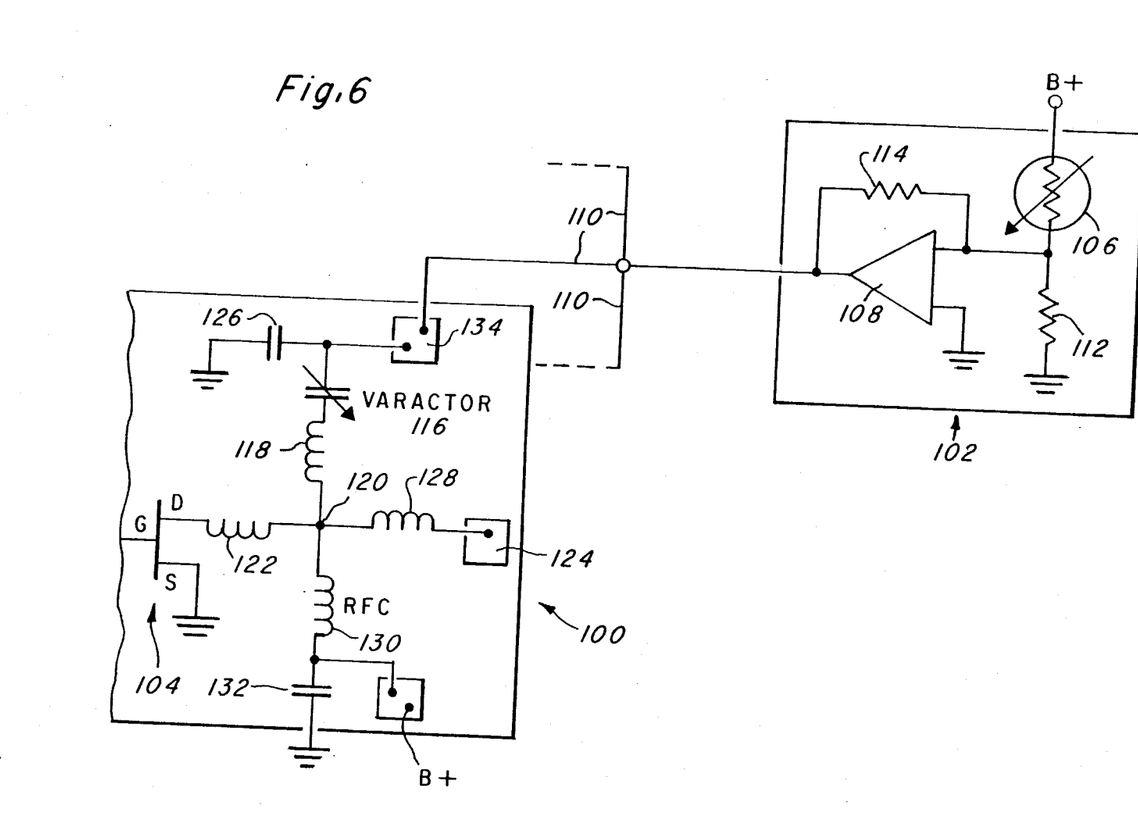
FIG. 6 shows the present invention used to provide on-chip temperature compensation for an arbitrary MMIC.

FIG. 6 illustrates the application of the present invention to temperature-compensation of an MMIC. Pictured is a portion of an MMIC 100, and an off-chip temperature-sensing module 102. The only portion of the MMIC 100 which is shown is an output stage, including an output transistor 104 and a compensating network according to the present invention.

The temperature-sensitive module 102 contains a thermistor 106, which together with an opamp 108 provides an output of voltage as a function of temperature. This output may be applied to many temperature compensating networks on many different MMICs, as is indicated schematically by the additional lines 110 shown connected to the output of opamp 108. By appropriately selecting the values of resistors 112 and 114, the offset and gain of the voltage (temperature) function generated by module 102 may be appropriately adjusted.

The output 110 is connected to provide bias to the temperature-compensating varactor 116. The resonance point of the circuit including varactor 116 and inductance 118, and therefore its complex impedance at the operating frequency of output transistor 104, is changed accordingly.

Typically the transconductance and channel resistance of an FET such as output transistor 104 will both vary with temperature. Thus, both the real and imaginary parts of the impedance of transistor 104, as seen from node 120, will vary with temperature. In particular, the real part of the impedance of transistor 104, viewed from node 120, will decrease, and additional capacitive reactance will be added to the imaginary part of the impedance. (Of course, the absolute sign of the imaginary part of the impedance will depend on the value of inductance 122.) Thus, to compensate for these temperature related effects, as viewed from output terminal 124, additional resistance should appear and less capacitive reactance should appear, to provide perfect compensation as temperature increases. However, as noted above, the varactor 116 provides exactly these characteristics, as its bias voltage is increased up to (not through) the region of the punch through voltage. Appropriate selection of the values of inductances 118, 122, and 128 will normally permit the varactor 116 to be operated in this region of its operating curve.

Even if the varactor 116 cannot be operated in this region of its operating curve, the variable-reactance characteristics only of the varactor 116 may also be used to provide temperature compensation. By setting the resonant frequency of varactor 116 and inductance 118 significantly above the usual operating frequency at room temperature, the output power provided to terminal 124 will be reduced. At higher temperatures, reducing the bias voltage across varactor 116 will lower the apparent reactive loading of the elements 116 and 118 as seen from node 120, so that a progressively larger portion of the output power of FET 104 appears at output terminal 124. This node of operation is analogous to that of the variable-attenuation method of temperature compensation, discussed above with reference to p-i-n diodes. Thus the varactor network in this case is used to create deliberate mismatch within the MMIC chip 100, and the desirable temperature-compensating effects are attained.

In addition, other circuit elements (not shown) can easily be added between bias voltage contact 134 and varactor 116, so that the common outputs 110 of temperature-sensing module 102 may be translated into different control voltages for each temperature compensating network within different MMICs.

Of course, a temperature-sensitive element may also be provided on-chip, but available temperature sensitive elements at this time are difficult and expensive to incorporate into an MMIC. It is therefore the presently preferred embodiment to use an arrangement such as that shown in FIG. 6, wherein the temperature-sensitive element is contained in a temperature-sensing module off-chip.

It is also of course possible to use the present invention to provide both impedance-matching and temperature compensation. This may be accomplished simply by including separately controlled varactors at each output terminal, or simply by controlling the bias voltage of varactor 116 to jointly optimize for impedance-matching and temperature compensation. The use of separate varactor networks for temperature compensation and impedance-matching, while physically larger, does have the advantage that, as noted above, the characteristics of the monolithic varactor described above, wherein both real and imaginary parts of the impedance vary with bias voltage, may be fully exploited.

The present invention has been specifically described with regard to the output stage of a VCO, but of course the same techniques may easily be adapted to an input stage. Similarly, the characteristics of a VCO are not necessary for the present invention, except that a broadband VCO presents a particularly difficult case where application of the present invention is particularly desirable. The present invention may also be applied to any other MMIC.

As will be obvious to those skilled in the art, further modification and adaptations of the present invention may easily be introduced, without affecting the scope of the inventive concepts contained therein.

What we claim is:

1. A monolithic microwave integrated circuit (MMIC), comprising:
   a monolithic substrate;
   means, located on said monolithic substrate for implementing a desired microwave circuit function;
   an impedance matching network, located on said monolithic substrate, comprising a varactor;

bias means connected to said varactor for providing a bias voltage across said varactor;

a plurality of bond pads on said substrate, respective ones of said pads being operatively connected to said implementing means to provide inputs and outputs thereto, at least one of said bond pads being connected both to said implementing means and to said impedance-matching network, whereby the capacitance of said varactor is controlled by said bias means to impedance-match said implementing means to a predetermined output impedance at said at least one bond pad.

2. The MMIC of claim 1, wherein said bias means consists of a connection between said varactor and one of said bond pads, whereby an external bias source can be used to control said bias voltage across said varactor.

3. The MMIC of claim 1, further comprising:
means, connected to said bias means, for sensing temperature;
wherein said bias means provides said bias voltage across said varactor variably in accordance with temperature.

4. The MMIC of claim 1 wherein said implementing means and said impedance matching network are integrated on a common semi-insulating substrate.

5. The MMIC of claim 1, wherein said monolithic substrate comprises GaAs.

6. The MMIC of claim 1, wherein said substrate comprises a semiconducting top layer atop a semi-insulating lower portion;
and wherein said varactor comprises:
an anode and a cathode formed on said semiconductor layer, said anode and cathode being coadjacent and spaced apart from each other;
said anode forming a Schottky barrier with said semiconductor layer;
the portion of said semiconductor layer beneath said anode being sufficiently thin and sufficiently lightly doped that punch through between said anode and said semi-insulating lower portion of said substrate occurs at a lower voltage than does breakdown between said anode and said cathode.

7. A monolithic microwave integrated circuit comprising:
(a) an output circuit element formed on a monolithic substrate.
(b) an output terminal on said substrate and connected to said circuit element; and
(c) an impedance matching network including a varactor on said substrate and connected to said output terminal, the bias for said varactor supplied by an adjustable voltage supply external to said substrate, the supplied bias adjusting the impedance of said network to make the output impedance of said circuit element plus network at said output terminal equal to a predetermined value.

8. The circuit of claim 7, wherein:
(a) the voltage of said voltage supply varies with temperature.

* * * * *